United States Patent [19]

Lemkey et al.

[11] 4,209,008

[45] Jun. 24, 1980

[54] PHOTON ABSORBING SURFACES AND METHODS FOR PRODUCING THE SAME

[75] Inventors: Franklin D. Lemkey, Glastonbury; Frank C. Douglas, Granby; Gerald S. Golden, Windsor; Clyde S. Brooks, Glastonbury, all of Conn.

[73] Assignee: United Technologies Corporation, Hartford, Conn.

[21] Appl. No.: 863,837

[22] Filed: Dec. 23, 1977

Related U.S. Application Data

[63] Continuation-in-part of Ser. No. 741,830, Jul. 26, 1977, Pat. No. 4,086,264.

[51] Int. Cl.² .............................................. F24J 3/02
[52] U.S. Cl. .................................. 126/452; 126/901; 428/615; 428/687; 156/634; 156/656; 156/657; 427/283
[58] Field of Search .................. 428/687, 608, 85, 90, 428/92, 96, 141, 143, 148, 615, 686, 913, 932; 126/270, 452, 901; 136/89 PC, 89 P, 206; 73/355 R; 427/283, 287, 343, 344, 436; 156/634, 656, 657; 432/1, 5

[56] References Cited

U.S. PATENT DOCUMENTS

| | | | |
|---|---|---|---|
| 3,594,292 | 7/1971 | Russel et al. | 428/687 X |
| 4,005,698 | 2/1977 | Cuomo | 126/270 |
| 4,036,206 | 7/1977 | Straup | 126/270 |
| 4,065,592 | 12/1977 | McAllister | 428/913 X |
| 4,065,593 | 12/1977 | Peterson | 428/913 X |
| 4,071,659 | 1/1978 | Santala | 126/901 X |
| 4,082,907 | 4/1978 | Schardein et al. | 126/270 X |
| 4,086,264 | 4/1978 | Brooks et al. | 252/454 |
| 4,148,294 | 4/1979 | Scherber et al. | 126/901 X |

*Primary Examiner*—Richard E. Schafer
*Attorney, Agent, or Firm*—Charles E. Sohl

[57] ABSTRACT

Photon absorbing surfaces which are effective over a broad band of photon energies are described. These surfaces consist of a two-phase material with a protruding second phase whose dimensions are on the order of microns. Photons are absorbed by multiple reflections within the region of the protruding phase. The surfaces are produced by directional solidification of eutectic compositions to produce aligned second phase microstructures within a metallic matrix. The matrix material is then selectively removed to expose the second phase material.

1 Claim, 3 Drawing Figures

30° VIEW ANGLE

30° VIEW ANGLE
5μ

20° VIEW ANGLE
2μ

30° VIEW ANGLE

PHOTON ABSORBING SURFACES AND METHODS FOR PRODUCING THE SAME

CROSS REFERENCE TO RELATED APPLICATION

This application is a continuation-in-part of pending application Ser. No. 741,830 which was allowed on July 26, 1977 now U.S. Pat. No. 4,086,264. This application is incorporated herein by reference.

BACKGROUND OF THE INVENTION

1. Field of the Invention

This invention relates to surfaces which absorb photons having wavelengths on the order of the wavelength of visible light. This invention also relates to the production of such surfaces by the directional solidification of eutectic compositions and the subsequent selective removal of one of the eutectic phases.

2. Description of the Prior Art

U.S. Pat. No. 4,005,698 describes a photon energy converter which consists of a surface having protruding tungsten dendrites. These dendrites do not extend into the substrate and are produced by the reduction of gaseous tungsten hexafluoride. The inventors of this patent also authored an article entitled "A New Concept For Solar Energy Thermal Conversion" in *Applied Physics Letters*, Vol. 26, No. 10, May 15, 1975, pages 557–559.

In a different subject area, but one which relates to this invention, it is known that under certain solidification conditions, an oriented microstructure may be produced in a eutectic composition. This is taught in U.S. Pat. Nos. 3,124,452; 3,528,808; 3,552,953; 3,554,817; 3,564,940 and 3,671,223, all of which are assigned to the assignee of the present invention.

SUMMARY OF THE INVENTION

Photon absorbing surfaces are produced by directionally solidifying a eutectic composition to produce a microstructure consisting of a continuous matrix phase containing an oriented second phase. The second phase is continuous and oriented in a direction which is substantially normal to the surface which will be the photon absorbed. The continuous matrix phase is selectively removed, leaving the second phase in relief. The exposed second phase traps incident photon energy by multiple reflections and converts it to thermal energy. The size and spacing of the second phase is on the order of microns. The matrix phase is preferably metallic and the protruding phase may be metallic or intermetallic. In one embodiment, the second phase occurs as oriented fibers, and in another embodiment the second phase has a porous, sponge-like morphology.

The foregoing and other objects, features and advantages of the present invention will become more apparent in the light of the following detailed description of preferred embodiments thereof as illustrated in the accompanying drawings.

DESCRIPTION OF PREFERRED EMBODIMENTS

Figure 1:
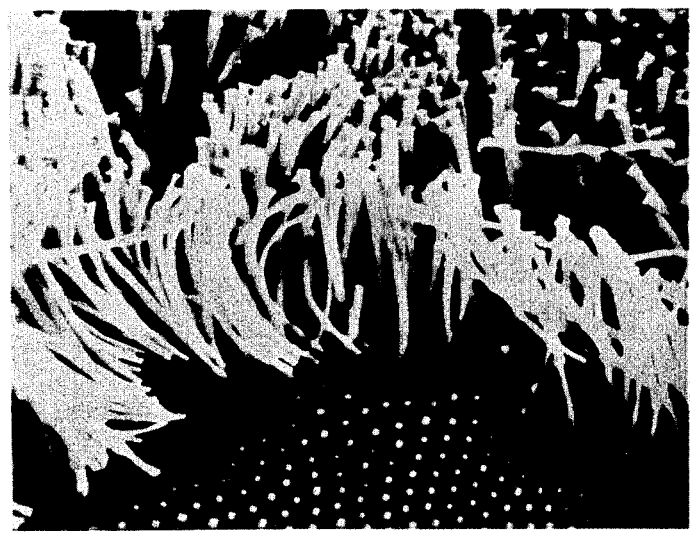
FIG. 1 shows a scanning electron micrograph of a directionally solidified aluminum-nickel eutectic.

The term "black body" is used to denote a body which is both a perfect absorber and perfect emitter of photon radiation. A black body is a theoretical concept which can be approached in practice by a hollow cavity having a small opening. To an outside observer, the opening is a near perfect emitter and absorber of photon radiation. The present invention employs a surface which consists of multiple protruding fibers, or sponge-like cells. Incident radiation striking a fiber or sponge pore wall will be reflected and will be absorbed during the several reflections that will invariably occur. Such surfaces shown can absorb radiation well in excess of 99% of that which would be absorbed by a perfect black body. Such a surface may be produced by directional solidification of a eutectic composition to produce an oriented second phase in a continuous matrix, followed by partial selective removal of the matrix.

The teachings of U.S. Pat. No. 3,124,452, which relates to the directional solidification of eutectic compositions, are incorporated herein by reference. Briefly, this patent discloses that slow progressive solidification of a molten eutectic composition wherein the solid-liquid interface may be constrained to be relatively flat and to move along a particular axis can produce an oriented fibrous microstructure wherein a fibrous second phase is oriented parallel to the direction of motion of the solid-liquid interface with controllable second phase size and morphology. In the case of a fiber-like second phase, fiber diameters are typically from about 0.01 to about 10 microns and fiber lengths may range from about 10 microns to continuous over the entire length of the solidified article. In the case of a cellular sponge-like phase, the cells will have dimensions on the order of microns. The term fibrous will be used in this aplication to denote fiber-like morphologies, rod-like morphologies, plate-like morphologies, and mixtures of these morphologies, and the term fiber will be used to denote rods and plates as well as fibers. Directionally solidified eutectic microstructures are usually observed to be "fibrous" within the preceding definition; however, in certain eutectic systems, a more acicular and interconnected fibrous second phase structure is observed. When the matrix is preferentially removed, this structure has an appearance similar to that of a sponge. Such a sponge-like structure will display a definite orientation. Both of the phases will be continuous in a direction parallel to the direction of heat flow during solidification. Eutectics which produce this type of structure include those which produce metalloid second phases in metallic matrices. The metalloids include C, B, Si, Se, Ge, and P. This type of structure has utility as a photon absorber and the present invention contemplates the use of such a structure. These structures are difficult to describe, but in cross section it can be seen that the two phases are oriented and arranged generally perpendicular to the substrate, and are continuous in the direction parallel to the direction of solidification. Although binary eutectics are usually employed, higher order eutectic compositions, such as ternary eutectics, may also be directionally solidified.

In the pure sense of the term, directional solidification implies a solidification process in which the solid-liquid interface is essentially flat. Since the second phase is oriented perpendicular to the solid-liquid interface, a flat interface will produce a maximum degree of alignment of the second phase. If solidification parameters are relaxed (a faster rate of solidification, a lower thermal gradient across the interface or a composition which is not exactly a eutectic), the solid-liquid interface will develop areas of curvature. This in turn reduces the degree of parallel alignment. For purposes of this invention, exact alignment is not necessary. It is only necessary that a high proportion of the fibers or sponge-like walls are aligned substantially perpendicular to a particular plane (usually the substrate). For purposes of this invention, the term directional solidification will be used to mean any eutectic solidification process which will result in more than about 50% of the fibers or sponge-like walls being oriented within about 45° to a particular plane.

For the purpose of this invention, any solidification procedure which will produce an oriented microstructure may be employed. The potential processes include solidification of bulk quantities of the eutectic material in a mold or other suitable container; solidification of a thin layer of eutectic material on a cold substrate, such as the solidification which is observed when a cold metallic substrate is dipped in molten metal; chemical vapor deposition; physical vapor deposition, and the like.

Virtually any oriented eutectic structure having suitably sized and oriented morphology and having a partially removed matrix can be used to absorb radiant energy. However, practical absorbers will have a metallic matrix for reasonable thermal conductivity and will have either metallic or intermetallic fibers. Metallic fibers and matrices are preferred for reasons of thermal conductivity. Examples of potential systems include aluminum-zinc, which can be solidified to produce zinc fibers in an aluminum matrix, aluminum-silicon which can be directionally solidified to produce silicon fibers in an sluminum matrix, and nickel-tungsten which can be directionally solidified to produce tungsten fibers in a nickel matrix. The preceding systems produce metallic fibers in metallic matrices. Systems such as nickel-aluminum-molybdenum can be directionally solidified to produce metallic fibers (in this case molybdenum) in an intermetallic matrix (in this case $Ni_3Al$). This is a practical system but is not preferred because of the thermal conductivity of the matrix. Other systems can be directionally solidified to produce a plate-like second phase in a continuous matrix. Examplary of such systems are cadmium-tin, cadmium-zinc and lead-tin. In each of these systems, the first element recited is the matrix element and the second element recited is the second phase element. As previously mentioned, certain solidification conditions can lead to a sponge-like second phase, which is really a degenerate form of the fibrous phase which forms under more perfect solidification conditions.

Once a desired microstructure has been obtained, it is necessary to preferentially remove the matrix material so as to expose the second phase. While there are many possible matrix removal methods, the method that appears to be most effective and most useful involves chemical removal. In virtually all eutectic systems, the matrix phase differs sufficiently from the fibers phase so that some chemical solution, either acidic or basic, can be employed to preferentially attack and remove the matrix phase. The specific chemical solution employed will, of course, depend upon the eutectic composition involved. The chemical dissolution can be accelerated by the application of heat, pressure, forced convection, and electric current or combinations thereof. Certain eutectics have matrices whose vapor pressures significantly exceed the vapor pressure of the second phase. In such systems, thermal evaporation might be employed to preferentially remove the matrix. More generally, any method which preferentially removes the matrix may be employed and the specific details of the preferential removal steps are not a part of this invention.

EXAMPLE 1

A nickel-aluminum eutectic composition containing 6.2 weight percent aluminum was directionally solidified at a rate of 11 centimeters per minute with a thermal gradient at the liquid interface of approximately 70° C. per centimeter to produce an aligned structure of $Al_3Ni$ fibers in an aluminum matrix. The solidified casting was sectioned so that the plane of the cut was perpendicular to the fiber axis. The matrix was then partially removed in a 2% solution of NaOH for one hour at room temperature. The resultant surface structure shown in FIG. 1 includes an area where a portion of the fibers were mechanically removed so as to better reveal the surface structure. The fibers can be seen to be exposed over an average length of about 15 microns and the average interfiber spacing is about two microns. The leaching treatment employed to partially remove the matrix also served to remove a portion of aluminum from the intermetallic fibers so that the exposed fibers were partially porous. The size of the pores is extremely small, on the order of perhaps 20–100Å and therefore has little effect on the absorption of photons by the surface.

EXAMPLE 2

Figure 2:
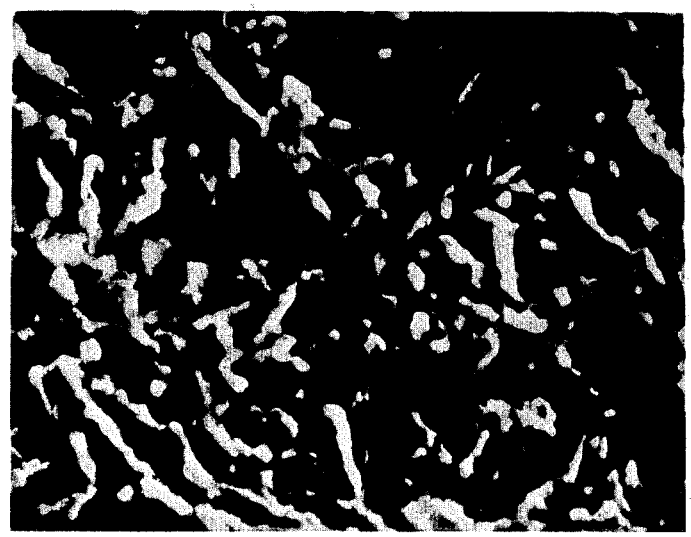
FIG. 2 shows a scanning electron micrograph of a directionally solidified aluminum-silicon eutectic.

A 3/8 inch diameter bar of aluminum silicon eutectic alloy containing 11% silicon was directionally solidified at 2 cm/hr. A wafer was cut perpendicular to the directional solidification axis for evaluation of its surface structure. The surface of the solidified article normal to the fiber direction was etched for one-half hour in a 2% NaOH solution at room temperature. The resultant sponge-like surface structure is shown in FIG. 2. This alloy system is one which forms a degenerate fibrous second phase structure.

EXAMPLE 3

The aluminum eutectic etched surfaces prepared in Examples 1 and 2 were evaluated for infrared reflectance as a function of wavelengths over a range of wavelengths from 2.5 to 20 microns. Over this range, the reflectance of the surfaces was less than about 0.1%.

EXAMPLE 4

Figure 3:
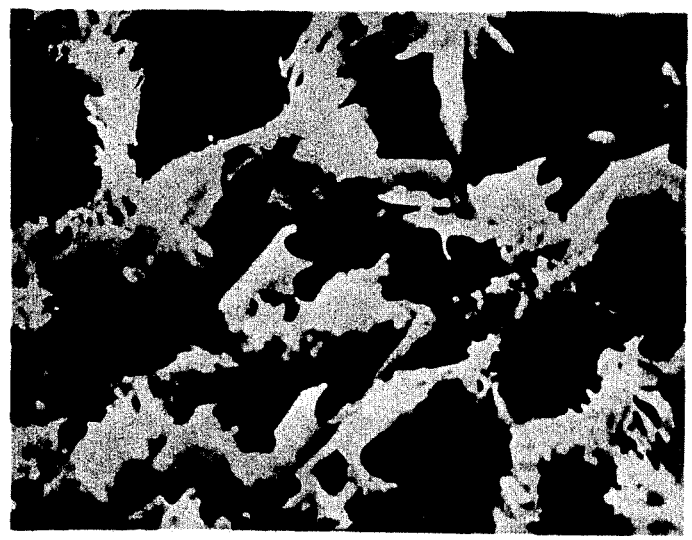
FIG. 3 shows a scanning electron micrograph of a directionally solidified aluminum-nickel eutectic.

A steel sheet was coated with an aluminum-6.2% nickel eutectic alloy by dipping the steel sheet in the molten alloy and quickly removing it. Solidification of the molten metal layer retained on the steel sheet was essentially unidirectional as a result of the heat flow into the steel substrate. The surface thus produced was etched in the 4% solution of NaOH at room temperature for one hour. A scanning electron microscope photograph of the resultant surface is shown in FIG. 3. As a consequence of the less than ideal solidification conditions, the resultant second phase microstructure is degenerate, lacking the perfection of the structure shown in FIG. 1, which is of the same composition but solidified under more ideal conditions.

EXAMPLE 5

The structure shown in FIG. 3 was evaluated for infrared reflectance over a range of wavelengths from 2.5 to 20 microns and the reflectance over this range was less than 0.1%. This illustrates that the perfection of the directionally solidified structure has little effect upon the efficacy of the material as a photon absorber.

Although this invention has been shown and described with respect to a preferred embodiment thereof, it should be understood by those skilled in the art that various changes and omissions in the form and detail thereof may be made therein without departing from the spirit and scope of the invention.

Having thus described a typical embodiment of our invention, that which we claim as new and desire to secure by Letters Patent of the United States is:

1. A method for collecting photon energy, and transforming it to thermal energy, comprising:
   a. providing an article having at least a surface portion of substantially eutectic composition;
   said surface portion having an oriented microstructure consisting of at least two phases, a continuous metallic matrix phase and a discontinuous second phase selected from the group consisting of metals, metalloids and intermetallics, with the second phase having dimensions on the order of 0.01 to 10 microns and with the second phase being oriented substantially normal to the surface; the surface portion of the matrix phase having been removed so that the second phase protrudes in relief.
   b. exposing said surface to incident photons whereby the photon energy is converted to thermal energy.

* * * * *